(12) United States Patent
Lee et al.

(10) Patent No.: US 8,632,635 B2
(45) Date of Patent: Jan. 21, 2014

(54) VAPOR DEPOSITION APPARATUS AND VAPOR DEPOSITION METHOD

(75) Inventors: Joo-Hyeon Lee, Yongin-si (KR); Jin-Koo Chung, Suwon-si (KR); Sung-Soo Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 813 days.

(21) Appl. No.: 12/535,568

(22) Filed: Aug. 4, 2009

(65) Prior Publication Data

US 2010/0143587 A1 Jun. 10, 2010

(30) Foreign Application Priority Data

Dec. 8, 2008 (KR) .................. 10-2008-0124033

(51) Int. Cl.
*C23C 16/00* (2006.01)

(52) U.S. Cl.
USPC .......................................... 118/726; 118/715

(58) Field of Classification Search
USPC .................................................. 118/726, 727
See application file for complete search history.

(56) References Cited

U.S. PATENT DOCUMENTS

| 4,651,674 A | * | 3/1987 | Hayashi et al. | 118/728 |
| 4,858,556 A | * | 8/1989 | Siebert | 118/664 |
| 4,897,290 A | | 1/1990 | Terasaka et al. | |
| 5,460,653 A | * | 10/1995 | Otani et al. | 118/668 |
| 7,166,006 B2 | | 1/2007 | Cok | |
| 2002/0185069 A1 | | 12/2002 | Hoffmann et al. | |
| 2003/0140858 A1 | * | 7/2003 | Marcus et al. | 118/726 |
| 2003/0193672 A1 | * | 10/2003 | Okada et al. | 356/630 |
| 2004/0000379 A1 | | 1/2004 | Slyke et al. | |
| 2004/0007183 A1 | | 1/2004 | Slyke et al. | |
| 2004/0255857 A1 | * | 12/2004 | Chow et al. | 118/715 |
| 2005/0011443 A1 | | 1/2005 | Matsukaze et al. | |
| 2005/0211172 A1 | * | 9/2005 | Freeman et al. | 118/726 |
| 2007/0014935 A1 | * | 1/2007 | Nakata et al. | 428/1.1 |
| 2007/0231460 A1 | * | 10/2007 | Ukigaya | 427/8 |
| 2008/0014825 A1 | * | 1/2008 | Fukuda et al. | 445/46 |
| 2010/0159132 A1 | * | 6/2010 | Conroy et al. | 427/248.1 |

FOREIGN PATENT DOCUMENTS

| JP | 2003-297570 A | 10/2003 |
| JP | 2004-095275 | 3/2004 |
| JP | 2004-207545 A | 7/2004 |
| JP | 2006-114427 A | 4/2006 |
| JP | 2008-140669 A | 6/2008 |
| JP | 2008-108611 A | 8/2009 |
| KR | 1020040009841 A | 1/2004 |
| KR | 100430104 B | 4/2004 |
| KR | 100517255 B | 9/2005 |
| KR | 1020080012748 A | 2/2008 |
| KR | 1020080049263 A | 4/2008 |
| KR | 1020080061668 A | 7/2008 |

* cited by examiner

*Primary Examiner* — Keath Chen
(74) *Attorney, Agent, or Firm* — Innovation Counsel LLP

(57) ABSTRACT

A vapor deposition apparatus includes a linear head including a plurality of nozzles, and an angle controller controlling an inclined angle of the linear head. The angle of inclination of the linear head can be varied so as to position different portions of the linear head at different distances from the surface of a substrate.

13 Claims, 3 Drawing Sheets

VAPOR DEPOSITION APPARATUS AND VAPOR DEPOSITION METHOD

CROSS-REFERENCE TO RELATED APPLICATION

This application claims priority to, and the benefit of, Korean Patent Application No. 10-2008-0124033 filed in the Korean Intellectual Property Office on Dec. 8, 2008, the entire contents of which are incorporated herein by reference.

BACKGROUND (a) Field

The present disclosure relates to semiconductor fabrication. More particularly, the present invention relates to a vapor deposition apparatus including a linear head, and a vapor deposition method.

(b) Description of the Related Art

To manufacture a display device such as a liquid crystal display device or an organic light emitting device, a plurality of processes for forming thin films and patterning them are often employed. Such devices often utilize thin films formed through processes such as chemical vapor deposition and physical vapor deposition. Physical vapor deposition methods may include methods utilizing evaporation, sputtering, ion plating, arc deposition, ion beam assisted deposition, and the like.

With the physical vapor deposition method, the usage of a point-type source has evolved into the usage of a linear source that can achieve deposition over a larger area. Linear sources often employ a linear head with multiple nozzles to obtain uniformity of deposition, while the size, number, and interval of the nozzles are controlled to improve the uniformity of the deposition.

However, it is possible to control the number and the interval of the nozzles for uniform deposition within only limited conditions, and it is difficult to guarantee uniform deposition when the conditions such as vapor pressure are changed.

SUMMARY

An exemplary embodiment of the present invention provides a vapor deposition apparatus and a method for more uniform deposition.

A vapor deposition apparatus according to an exemplary embodiment of the present invention includes a linear head including a plurality of nozzles, and an angle controller controlling an angle of inclination of the linear head.

A plurality of deposition speed sensors disposed to correspond to at least two of a starting position, a middle position, and an ending position of the linear head may be further included.

The plurality of deposition speed sensors may include first to third deposition speed sensors respectively corresponding to the starting position, the middle position, and the ending position of the linear head.

A linear head control unit directing the angle controller to control the angle of inclination of the linear head, and including a driving controller driving the linear head and the angle controller, may be further included.

The linear head control unit may further include a sensing controller receiving a signal from the deposition speed sensor corresponding to deposition speed, and calculating the corresponding angle of the linear head so as to achieve uniform values of the deposition speeds.

The linear head control unit may further include a material supplying unit evaporating the deposition source and supplying the evaporated deposition source to the linear head.

The angle controller may be disposed corresponding to the starting position of the linear head, and may include a channel through which an evaporated deposition source is passed.

The linear head control unit may further include a user interface.

A sensor position controller controlling a position of the deposition speed sensor may be further included.

The angle controller may be disposed corresponding to the starting position of the linear head, and may include a channel through which an evaporated deposition source is passed.

A driving controller may also be included, driving the angle controller so as to control the angle of the linear head. Also included may be a linear head control unit that includes a material supplying unit evaporating the deposition source and supplying the evaporated deposition source to the linear head.

The linear head control unit may further comprise a sensing controller receiving a signal from the deposition speed sensor corresponding to the deposition speed, and calculating the corresponding angle of the linear head so as to achieve uniform values of the deposition speeds.

A substrate supporter fixing a substrate may be further included, and the angle controller may control the angle of inclination of the linear head with respect to a surface of the substrate.

According to a further embodiment of the invention, a vapor deposition method for a vapor deposition apparatus including a linear head having a plurality of nozzles according to an exemplary embodiment of the present invention includes: measuring a deposition speed corresponding to at least two positions along a linear head; controlling an angle of inclination of the linear head according to the measured deposition speeds; and executing a deposition process with the angled linear head.

The vapor deposition apparatus according to an exemplary embodiment of the present invention is used to control the inclined angle of the linear head such that uniform deposition may be realized regardless of the deposition conditions.

BRIEF DESCRIPTION OF THE DRAWINGS

For a better understanding of the disclosure, reference is made in the following detailed description to the accompanying drawings.

DETAILED DESCRIPTION OF EMBODIMENTS

Figure 1:
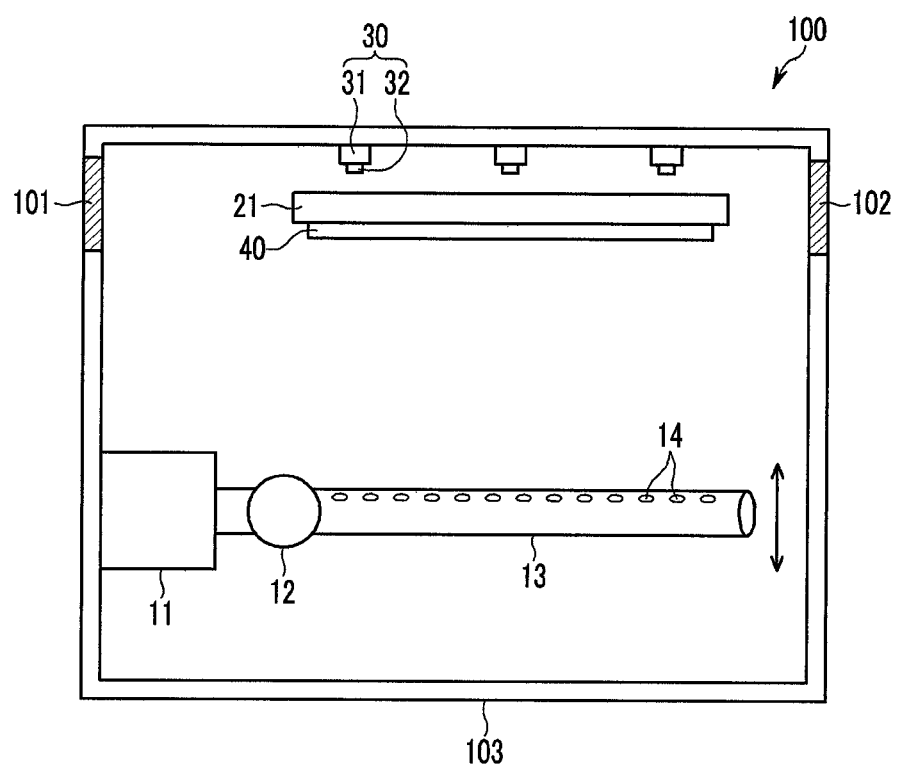
FIG. 1 is a schematic view of a vapor deposition apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the various components are retrenched or exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
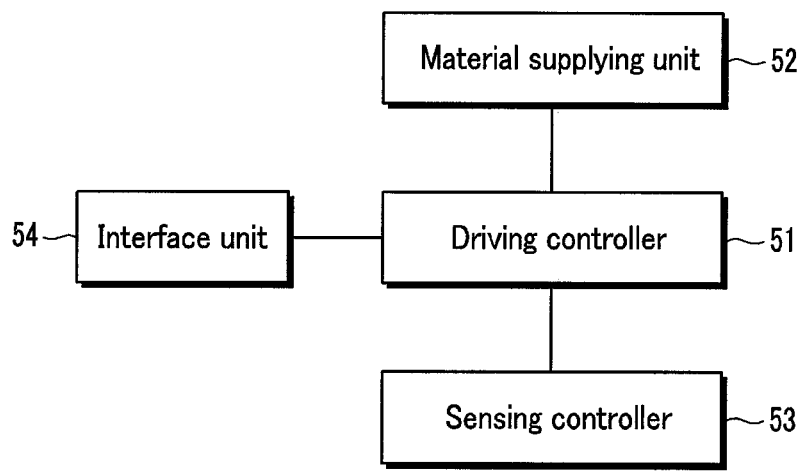
FIG. 2 is a block diagram of a linear head control unit in a vapor deposition apparatus according to an exemplary embodiment of the present invention.

FIG. 1 is a schematic view of a vapor deposition apparatus according to an exemplary embodiment of the present invention, and FIG. 2 is a block diagram of a linear head control unit in a vapor deposition apparatus according to an exemplary embodiment of the present invention.

A vapor deposition apparatus 100 according to an exemplary embodiment of the present invention includes a device outer wall 103, a linear head 13, an angle controller 12, a linear head control unit 11, a substrate supporter 21, and a deposition speed sensor 30.

The device outer wall 103 has a substrate input door 101 and substrate output door 102. A substrate 40 is inserted through substrate input door 101. Once deposition is complete, the substrate 40 can be removed through substrate output door 102.

The linear head 13 includes a plurality of nozzles 14 through which an evaporated deposition source is outgassed. The size of the nozzles 14 may be uniform, or may be gradually increased with a uniform ratio from one end of the linear head 13 to the other. The interval between the nozzles 14 may also be uniform, or may be gradually increased with a uniform ratio from one end of the linear head 13 to the other.

The angle controller 12 is installed on one end of the linear head 13, and controls the angle of the linear head 13 with respect to the substrate 40. The angle controller 12 includes a path, e.g. a channel or tubular passageway, through which to transport the evaporated deposition source to the linear head 13. This passageway also functions as a rotation axis of the linear head 13. The position or the shape of the angle controller 12 are not limited to the configuration shown, and any other position or shape may be applied so long as the inclined angle of the linear head 13 with respect to the substrate 40 is able to be controlled.

Referring to FIG. 2, the linear head control unit 11 includes a driving controller 51, material supplying unit 52, sensing controller 53, and interface unit 54. The driving controller 51 controls the angle of the linear head 13, as well as the movement of the linear head 13 and the angle controller 12. The material supplying unit 52 evaporates the deposition source and supplies the resulting vapor to the linear head 13. The sensing controller 53 receives a signal from the deposition speed sensor 30 to calculate a deposition speed, and determines the corresponding angle of the linear head 13. The sensing controller 53 can also transmit the angle to the driving controller 51, or display the angle through an interface unit 54. Additionally, the sensing controller 53 directs the sensor position controller 31, so as to control the position of (and thus the portion of substrate 40 monitored by) deposition speed sensor 32. The interface unit 54 allows a user to manually control the driving controller 51, the sensing controller 53, and the material supplying unit 52.

The substrate supporter 21 fixes thereto the deposition object, i.e. the substrate 40 (for example an LCD panel substrate).

The deposition speed sensor 30 includes a sensor position controller 31 and deposition speed sensor 32 that can preferably be positioned corresponding to any point along the linear head 13. When measuring the respective deposition speed, the deposition speed sensor 32 detects the rate at which evaporated source material is to be deposited on substrate 40 when a corresponding part of the substrate is located at the sensor position, and converts the detected signal into an electrical signal to transmit it to the linear head control unit 11. More specifically, when measuring the respective deposition speed, the sensor position controller 31 places its respective deposition speed sensor 32 at the respective position where a respective surface portion of the substrate 40 is to be disposed. However, deposition speed sensor 32 is moved toward the device outer wall 103 when the deposition of the substrate 40 is actually executed so as not to disturb the deposition.

As described above, in the vapor deposition apparatus 100 of this embodiment, all or portions of various constituent elements included in the vapor deposition apparatus 100 may be omitted, and the function of each constituent element and their arrangement may be changed. For example, if other means to control the angle of the linear head 13 with respect to the substrate 40 are possible, elements of the vapor deposition apparatus 100 may be varied or omitted. For instance, the linear head 13 and the substrate 40 may be disposed to be vertical with respect to the bottom surface.

The vapor deposition apparatus 100 may deposit any suitable material used in a deposition process. For example, the apparatus 100 may be used to deposit an organic material when manufacturing an organic light emitting device.

Next, a method of using the vapor deposition apparatus 100 will be described.

Figure 3:
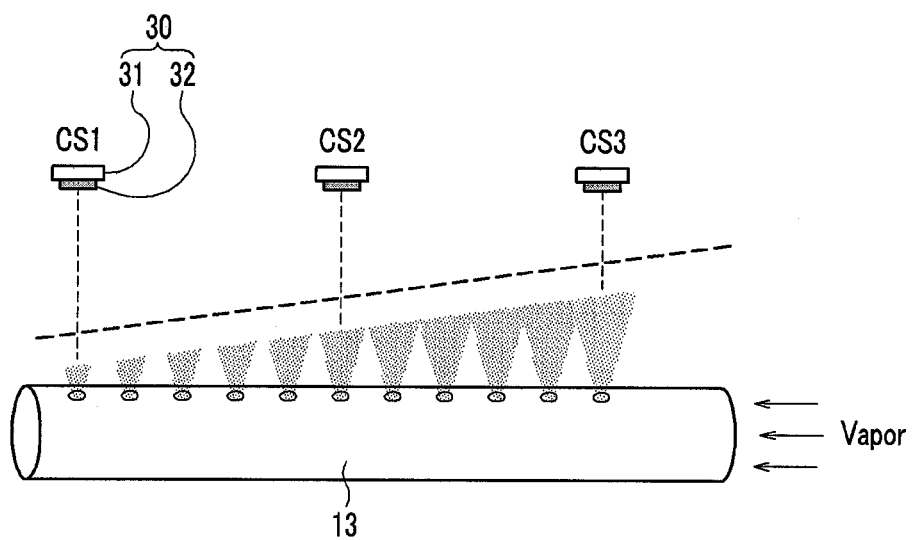
FIG. 3 and FIG. 4 are schematic views showing a process to improve deposition uniformity by controlling a linear head in a vapor deposition apparatus according to an exemplary embodiment of the present invention.
Figure 4:
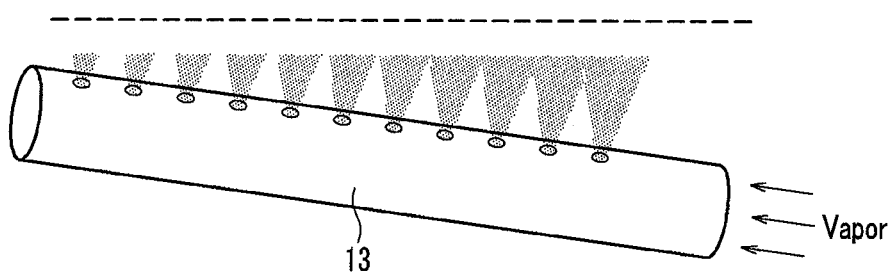

FIG. 3 and FIG. 4 are schematic views showing a process to improve deposition uniformity by controlling a linear head in a vapor deposition apparatus according to an exemplary embodiment of the present invention.

First, as shown in FIG. 3, vapor from an evaporated deposition source is supplied to a linear head 13 that is disposed horizontally. The deposition speed of the exhausted deposition source (that is ejected through the nozzles of the linear head 13) is then measured. Here, the deposition speed sensor 32 is moved so as to examine various points on the substrate 40, so as to determine the rate of deposition upon various areas of substrate 40.

Table 1 shows measured deposition speeds at points CS1-CS3, and measured ratios of the deposition speed CS1/CS2 and CS3/CS2 (i.e., ratios of deposition speeds measured at point CS1 to those measured at point CS2, and speeds measured at CS3 to those measured at CS2, respectively). The data for Table 1 were gathered by varying vapor pressure (i.e., varying the rate of ejection of vapor from linear head 13) so as to achieve integer values of deposition speed measured at point CS2. Corresponding values at CS1 and CS3 were then also measured. The integer values for CS2 ranged from 1 Å/second to 20 Å/second, with the interval between three deposition speed sensors CS1, CS2, and CS3 being 460 mm, and the distance from the linear head 13 to the deposition speed sensor CS1, CS2, and CS3 being 100 mm.

TABLE 1

| CS1/CS2 [%] | CS1 Å/sec | CS2 Å/sec | CS3 Å/sec | CS3/CS2 |
|---|---|---|---|---|
| 73.00 | 0.73 | 1 | 1.39 | 139.00 |
| 79.50 | 1.59 | 2 | 2.48 | 124.00 |
| 81.67 | 2.45 | 3 | 3.54 | 118.00 |
| 82.50 | 3.30 | 4 | 4.53 | 113.25 |
| 85.80 | 4.29 | 5 | 5.54 | 110.80 |
| 87.00 | 5.22 | 6 | 6.51 | 108.50 |
| 87.71 | 6.14 | 7 | 7.6 | 108.57 |
| 88.25 | 7.06 | 8 | 8.33 | 104.13 |

TABLE 1-continued

| CS1/CS2 [%] | CS1 Å/sec | CS2 Å/sec | CS3 Å/sec | CS3/CS2 |
|---|---|---|---|---|
| 91.67 | 8.25 | 9 | 9.30 | 103.33 |
| 93.70 | 9.37 | 10 | 10.22 | 102.20 |
| 95.00 | 10.45 | 11 | 11.2 | 101.82 |
| 97.25 | 11.67 | 12 | 12.15 | 101.25 |
| 98.23 | 12.77 | 13 | 13.13 | 101.00 |
| 98.86 | 13.84 | 14 | 14.09 | 100.64 |
| 99.20 | 14.88 | 15 | 15.07 | 100.47 |
| 99.31 | 15.89 | 16 | 16.07 | 100.44 |
| 99.41 | 16.90 | 17 | 17.05 | 100.29 |
| 99.56 | 17.92 | 18 | 18.04 | 100.22 |
| 99.63 | 18.93 | 19 | 19.04 | 100.21 |
| 99.75 | 19.95 | 20 | 20.03 | 100.15 |

As shown in Table 1, the gap between successive ratios CS1/CS2 and CS3/CS2 increases as deposition speed CS2 drops.

One can see that deposition speed varies by position along linear head 13, and also varies with vapor pressure (i.e., deposition condition). In particular, deposition speed upon substrate 40 decreases with distance from angle controller 12, i.e. decreases from CS3 to CS1. Additionally, this effect becomes more pronounced as vapor pressure is reduced, i.e. as deposition speeds are reduced. Accordingly, if uniform deposition speed is desired, one must compensate for the effect of position along linear head 13. As shown in FIG. 4, one method of compensating for this effect is to position linear head 13 at an angle with respect to substrate 40.

More specifically, if it can be determined how deposition speed varies along linear head 13, the angle of inclination of linear head 13 can be varied so as to position different portions of linear head 13 at different distances from the surface of substrate 40. Here, a difference of the deposition speed at the starting position CS3, the middle position CS2, and the ending position CS1 is determined. As shown in FIG. 4, the linear head 13 is inclined with respect to the surface of substrate 40 (indicated by the dotted line), so that deposition speed is uniform across substrate 40. Inclining of the linear head 13 is executed by driving the angle controller 12. This process may be automatically executed through calculation of the sensing controller 53 and driving of the driving controller 51 (e.g., employing feedback control in sensing controller 53, to measure deposition speeds at CS1-CS3, and control the angle of linear head 13 to achieve uniform deposition speed along the surface of substrate 40), or may be manually executed by the user through the interface unit 54.

As above-described, the inclined angle of the linear head 13 is controlled to obtain a uniform deposition speed such that uniform deposition may be realized regardless of the deposition conditions.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A vapor deposition apparatus comprising:
    a linear head including a plurality of nozzles distributed along a length of the head and including an inlet through which a deposition vapor can be injected into the head at a corresponding pressure for subsequent ejection through the nozzles and toward one or more definable deposition planes spaced apart from the head;
    a plurality of deposition speed sensors distributively disposed in correspondence to the length of the head and configured for measuring effective deposition rates of the deposition vapor along at least a first of the definable deposition planes when the deposition vapor is ejected from corresponding ones of the nozzles toward the at least first deposition plane; and
    an angle controller operatively coupled to and responsive to the deposition speed sensors and configured to controlling an angle of inclination of the linear head with respect to a second predetermined deposition plane, said second predetermined deposition plane being one at which a surface of a to be supplied substrate is to be disposed so as to receive the deposition vapor ejected from the nozzles when inlet at said corresponding pressure, where during actual deposition, a surface of the supplied substrate is coincident with said predetermined second deposition plane and the head is inclined under control of the angle controller at an angle of inclination relative to the second deposition plane, the angle being determined according to respective measurements made by the deposition speed sensors of the corresponding effective deposition speeds from the nozzles of the inclined head to the predetermined first deposition plane when the sensors occupy the predetermined first deposition plane.

2. The vapor deposition apparatus of claim 1, wherein the plurality of deposition speed sensors are disposed to correspond to at least two of a starting nozzle position closest to the deposition vapor inlet of the linear head, a middle nozzle position, and an ending nozzle position furthest away from the deposition vapor inlet of the linear head.

3. The vapor deposition apparatus of claim 2, wherein the plurality of deposition speed sensors comprise first to third deposition speed sensors respectively corresponding to the starting nozzle position, the middle nozzle position, and the ending nozzle position of the linear head.

4. The vapor deposition apparatus of claim 3, further comprising
    a linear head control unit directing the angle controller to control the angle of inclination of the linear head, and including a driving controller driving the linear head and the angle controller.

5. The vapor deposition apparatus of claim 4, wherein the linear head control unit further comprises a sensing controller receiving at least one signal from the plurality of deposition speed sensors corresponding to the deposition speed at a respective position along the first deposition plane, and calculating the corresponding angle of inclination of the linear head relative to the second deposition plane so as to achieve substantially uniform values of the deposition speeds along the second deposition plane.

6. The vapor deposition apparatus of claim 5, wherein the linear head control unit further comprises a material supplying unit evaporating the deposition source and supplying the evaporated deposition source to the linear head.

7. The vapor deposition apparatus of claim 6, wherein an angle-forming joint controlled by the angle controller is disposed corresponding to the starting nozzle position of the linear head, and includes a channel through which an evaporated deposition source is passed.

8. The vapor deposition apparatus of claim 7, wherein the linear head control unit further comprises a user interface.

9. The vapor deposition apparatus of claim 2, further comprising
for each deposition speed sensor, a corresponding sensor position controller controlling a position of the respective deposition speed sensor.

10. The vapor deposition apparatus of claim 1, wherein
an angle-forming joint controlled by the angle controller is disposed corresponding to a starting nozzle position of the linear head, and includes a channel through which the deposition vapor is passed, the starting nozzle position being one closest to the inlet.

11. The vapor deposition apparatus of claim 10, further comprising
a driving controller driving the angle controller so as to control the angle of inclination of the linear head, and a linear head control unit including a material supplying unit evaporating the deposition source and supplying the evaporated deposition source to the linear head.

12. The vapor deposition apparatus of claim 11, wherein
the linear head control unit further comprises a sensing controller receiving at least one signal from the plurality of deposition speed sensors corresponding to the deposition speed, and calculating the corresponding angle of inclination of the linear head so as to achieve uniform values of the deposition speeds.

13. The vapor deposition apparatus of claim 1, further comprising
a substrate supporter fixing the substrate thereto, wherein the angle controller controls the angle of inclination of the linear head with respect to a surface of the substrate supporter.

* * * * *